US012142705B2

(12) United States Patent
Nan et al.

(10) Patent No.: US 12,142,705 B2
(45) Date of Patent: Nov. 12, 2024

(54) METHOD FOR REGULATING PHOTOCURRENT OF IGZO BASED ON TWO-DIMENSIONAL BLACK PHOSPHORUS MATERIAL

(71) Applicant: Jiangnan University, Wuxi (CN)

(72) Inventors: Haiyan Nan, Wuxi (CN); Daqing Li, Wuxi (CN); Feng Shao, Wuxi (CN); Shaoqing Xiao, Wuxi (CN); Xiaofeng Gu, Wuxi (CN)

(73) Assignee: Jiangnan University, Wuxi (CN)

( * ) Notice: Subject to any disclaimer, the term of this patent is extended or adjusted under 35 U.S.C. 154(b) by 282 days.

(21) Appl. No.: 17/828,096

(22) Filed: May 31, 2022

(65) Prior Publication Data

US 2022/0302335 A1    Sep. 22, 2022

Related U.S. Application Data

(63) Continuation of application No. PCT/CN2020/093208, filed on May 29, 2020.

(30) Foreign Application Priority Data

Dec. 31, 2019  (CN) .......................... 201911421184.8

(51) Int. Cl.
  *H01L 31/18*   (2006.01)
  *H01L 31/109*  (2006.01)
(52) U.S. Cl.
  CPC ........ *H01L 31/109* (2013.01); *H01L 31/1884* (2013.01)
(58) Field of Classification Search
  CPC .......................... H01L 31/109; H01L 31/1884
  See application file for complete search history.

(56) References Cited

U.S. PATENT DOCUMENTS

| 11,417,775 | B2* | 8/2022 | Shivaraman | ............ H01L 24/17 |
| 2017/0160841 | A1* | 6/2017 | Lou | ........................ G06F 3/0412 |

(Continued)

FOREIGN PATENT DOCUMENTS

| CN | 105679876 A | 6/2016 |
| CN | 108493288 A | 9/2018 |
| CN | 111081820 A | 4/2020 |

OTHER PUBLICATIONS

Machine Translation of IDS Reference CN111081820A.*

(Continued)

*Primary Examiner* — Suberr L Chi
(74) *Attorney, Agent, or Firm* — IPRO, PLLC; Na Xu

(57) ABSTRACT

The disclosure relates to a method for regulating photocurrent of IGZO based on a two-dimensional black phosphorus material, and belongs to the field of semiconductor devices. The disclosure provides a method for preparing an IGZO-black phosphorus heterostructure by dry transfer technology, and by changing the contact mode between IGZO and black phosphorus, photocurrent response of the IGZO to different laser light wavelengths can be regulated. In the method, both a channel and electrodes of the IGZO are magnetron sputtered by means of masks, and the method has good repeatability and can realize preparation of large-area multi-devices. A black phosphorus sample is prepared by a mechanical exfoliation method, and has controllable thickness and size. A heterojunction is prepared by dry transfer technology, and the technology is easy to operate and highly controllable. The disclosure is beneficial to promote development of IGZO thin films in the micro-nano field and the semiconductor industry.

10 Claims, 20 Drawing Sheets

(56) References Cited

U.S. PATENT DOCUMENTS

2019/0026519 A1    1/2019  Park et al.
2019/0148499 A1*   5/2019  Lin ..................... H01L 29/861
                                                          257/288

OTHER PUBLICATIONS

Dastgeer et al., "Black Phosphorus-IGZO van der Waals Diode with Low-Resistivity Metal Contacts", Feb. 26, 2019, ACS Appl. Mater. Interfaces, vol. 11, pp. 10959-10966.*

Li et al., "High performance IGZO-based phototransistors by BN/BPinterface engineering", Oct. 12, 2020, Nanotechnology, vol. 32, pp. 1-8.*

Improved machine translation of CN111081820A.*

Dastgeer Ghulam et. al., "Black Phosphorus-IGZO van der Waals Diode with Low-Resistivity Metal Contacts", ACS Appl. Mater. Interfaces, v11, No. 11, p. 10960. Feb. 26, 2019.

* cited by examiner

METHOD FOR REGULATING PHOTOCURRENT OF IGZO BASED ON TWO-DIMENSIONAL BLACK PHOSPHORUS MATERIAL

TECHNICAL FIELD

The disclosure relates to a method for regulating photocurrent of IGZO based on a two-dimensional black phosphorus material, and belongs to the field of semiconductor devices.

BACKGROUND

Amorphous indium gallium zinc oxide (IGZO for short) is a new type of transparent oxide semiconductor material having features such as wide band gap (~3.5 eV), high mobility (~35.8 $cm^2V^{-1}s^{-1}$), lower preparation temperature and extremely high stability, is a research hotspot in the field of display at present, and is also considered to be an important material in development of flexible display technology, flexible wearable electronic technology and new sensing technology. In 2004, Hosono, Nomura, and other researchers realized preparation of a flexible substrate PET fully transparent thin film transistor (TFT) using IGZO at room temperature for the first time, and the transistor has a field-effect mobility exceeding 10 $cm^2V^{-1}s^{-1}$, and is an order of magnitude higher than previously reported silicon transistors. Soon, the material attracted the attention of researchers and display panel manufacturers around the world. At present, high-resolution small and medium-sized display screens based on IGZO TFT have been mass-produced, and IGZO panels produced by Sharp Corporation have been applied to high-end mobile terminal equipment.

Flexible photoelectric devices based on IGZO are widely used the industrial, medical, civil, aerospace, national defense, military and other fields. However, with the deepening of research, it is found that although IGZO has good electrical properties such as high mobility, disordered arrangement of atoms will cause many defects in a material structure. These defect states interact with electrons in a conduction band or change their properties under the action of external bias voltage, light, etc., and this will have a great impact on the transport of carriers and the stability of materials, leading to unstable photoelectric performance of a device. Moreover, since a photoelectric detector is a semiconductor device capable of converting a radiated optical signal into an electrical signal, the magnitude of photocurrent directly corresponds to the conversion efficiency, that is, the magnitude of the photocurrent can be regulated to effectively realize regulation of the sensitivity of a device to external light. In practical applications, different sensitivities of photoelectric devices are required in different occasions. For example, for a photoelectric detector in the range of ordinary visible light, it is desired that the photoelectric detector has a very sensitive response to light, that is, the photocurrent and responsivity should be high. However, for detectors used in aerospace, national defense, military or other fields, it is more desirable that a device is insensitive to light in the range of visible light, that is, the device hardly responds to maintain stability, and has a sensitive response in a specific solar-blind ultraviolet region or deep infrared region. Therefore, for photoelectric devices, it is crucial to regulate their photoelectric performance.

Conventional methods for regulating the performance of semiconductor photoelectric devices include doping, preparation of a periodic array structure, and selection of different contact electrode materials. For example, the current methods for regulating the performance of IGZO devices mainly include: changing of a device structure, such as preparing periodic structures with different thicknesses and constructing structures with different morphologies (columnar, rectangular, etc.); changing of the relative positions of device electrodes, such as reverse overlapped back gate, reverse overlapped top gate, coplanar back gate and coplanar top gate structures; and selection of device electrode materials, such as Ti/Au, IZO, Al, Cu and other metal materials. Moreover, annealing at different temperatures for different periods of time is also a commonly used method to control the performance of IGZO devices. However, the above-mentioned commonly used methods are not only complicated to operate, but also difficult to improve photocurrent.

Since the two-dimensional semiconductor material black phosphorus was discovered in 2014, it has rapidly attracted extensive research due to its high mobility (1000 $cm^2V^{-1}s^{-1}$), high on-off ratio ($10^3$-$10^5$) and high near-infrared absorption rate. However, research found that single-layer and thin-layer (within ten layers) black phosphorus is easily oxidized and decomposed in air and is not stable. Moreover, photoelectric response of black phosphorus devices in the near-infrared band is weak, and this greatly limits their application in the fields of electronics and photoelectronics.

Regulation of photoelectric performance based on a heterojunction structure is a common regulating method for two-dimensional semiconductor photoelectric devices, for example, acceleration of the response time of black phosphorus through a black phosphorus-graphene heterojunction; widening of the response wavelength and increase of the responsivity through a black phosphorus-XY2 (X=Mo, W; Y=S, Se) heterojunction; and realization of ultra-high and ultra-fast response of a device in the ultraviolet band through a black phosphorus-rhenium sulfide heterojunction. However, the above heterostructures are all realized based on two-dimensional materials, and have the problems that the sample size is small, transfer of a heterojunction and a preparation process of a device are complicated, and the device performance is not stable enough.

SUMMARY

Technical Problem

In view of the problems that a current method for regulating photocurrent of IGZO devices is complicated to operate and difficult to realize improvement of the photocurrent, and when optoelectronic performance is regulated based on construction of a heterojunction structure, the heterostructure is realized based on two-dimensional materials, the sample size is small, transfer of a heterojunction and a preparation process of a device are relatively complicated, and device performance is not stable enough, the disclosure provides a method for regulating photocurrent of IGZO based on a two-dimensional black phosphorus material.

Technical Solution

The disclosure adopts a method for constructing a black phosphorus-IGZO vertical P—N heterojunction, and regulates the photocurrent of an IGZO device by changing the thickness of a black phosphorus sample, the channel width of the IGZO device and the contact area between the black phosphorus and the IGZO. The IGZO device is prepared by a mask magnetron sputtering method. An electrode uses IZO, and the device has a simple structure and a large area. Black phosphorus uses a sample with 10 or more layers, and has high stability. A heterostructure is prepared by a dry transfer technology, and the technology is easy to operate and highly controllable. By changing the thickness of the black phosphorus and the contact mode between the black phosphorus and the IGZO, transfer of charges can be achieved, thereby regulating the photocurrent intensity in the IGZO.

The first objective of the disclosure is to provide a method for constructing an IGZO-black phosphorus heterojunction. The method includes: preparing an IGZO device with different channels, transferring black phosphorus samples with different thicknesses into the prepared IGZO device channel by dry transfer technology, and preparing IGZO-black phosphorus heterojunctions with different structures by changing the contact mode between the black phosphorus and the IGZO.

In an implementation mode of the disclosure, a method for preparing the IGZO device with different channels includes the following steps:

(1) preparing a set of masks, wherein the masks for preparing an IGZO channel layer are marked as masks I, and the masks for preparing an electrode on the surface of IGZO are marked as masks II;

(2) ultrasonically cleaning a substrate in acetone, ethanol, and deionized water in sequence, drying the substrate after cleaning, and finally baking the substrate on a heating platform to remove acetone, ethanol and other residues to obtain a clean substrate;

(3) fixing the mask I prepared in step (1) on the surface of the treated substrate, then placing the whole substrate in a magnetron sputtering cavity, evacuating the cavity to a vacuum degree equal to or less than 10 Pa, and depositing an active layer IGZO thin film by radio frequency magnetron sputtering; and (4) aligning and pressing the mask II prepared in step (1) on the surface of the deposited IGZO thin film under a microscope in such a way that the areas to be plated with electrodes are exposed and the channel area is blocked, and then putting the whole into a magnetron sputtering or thermal evaporation cavity to prepare source/drain electrode materials, thereby forming an IGZO device with electrodes on both sides and a channel in the middle after the source/drain electrodes are prepared.

In an implementation mode of the disclosure, the channel width of the mask I in step (1) is of any specification less than 100 um.

In an implementation mode of the disclosure, the channel width of the mask I in step (1) is 40 um.

In an implementation mode of the disclosure, the substrate in step (2) is any one of $SiO_2/Si$, $SiOx/Si$, $La_2O_3/Si$, $Al_2O_3/Si$, ITO, and PET.

In an implementation mode of the disclosure, the specific method for cleaning the substrate in step (2) is as follows: first, ultrasonically cleaning the substrate in an acetone solution (at a frequency of 25 KHZ) for 5 min; then cleaning the substrate in an ethanol solution under the ultrasonic condition of the same frequency for 5 min; then ultrasonically cleaning the substrate in deionized water at the same frequency for 5 min; then blowing dry the substrate with a nitrogen gas gun; and finally, baking the substrate on a heating platform at 350° C. for 30 min.

In an implementation mode of the disclosure, the specific method for depositing the active layer IGZO thin film by radio frequency magnetron sputtering in step (3) is as follows: IGZO is sputtered at gas flow rates of argon and oxygen of 10 mL/min and 0.3 mL/min respectively, a reaction pressure of 400 mPa, and a sputtering power of 1.76 $W/cm^2$ for 3 min.

In an implementation mode of the disclosure, the thickness of the active layer IGZO thin film deposited by radio frequency magnetron sputtering in step (3) is 10 nm-40 nm.

In an implementation mode of the disclosure, the thickness of the active layer IGZO thin film deposited by radio frequency magnetron sputtering in step (3) is 10 nm.

In an implementation mode of the disclosure, the source/drain electrode materials in step (4) are any one of magnetron sputtered IZO, magnetron sputtered ITO, and metallic Au, Al, and Cu prepared by thermal evaporation or electron beam evaporation.

In an implementation mode of the disclosure, when the source/drain electrode materials in step (4) are magnetron sputtered IZO, the electrode IZO is deposited at a gas flow rate of inlet argon of 10 mL/min, a reaction pressure of 400 mPa, and a sputtering power of 1.76 $W/cm^2$ for 10 min, and the thickness of the source/drain IZO thin films is 100 nm.

In an implementation mode of the disclosure, when the source/drain electrode materials in step (4) are magnetron sputtered ITO, the electrode ITO is sputtered at a gas flow rate of inlet oxygen of 0.5 mL/min, a reaction pressure of 50 mPa, and a sputtering power of 1.76 $W/cm^2$ for 5 min, and the thickness of the source/drain ITO thin films is 100 nm.

In an implementation mode of the disclosure, when the source/drain electrode materials in step (4) are Au, Al, Cu and other metals prepared by electron beam evaporation, evaporation is performed at a current of 60 A for 5 min, and the thickness of the obtained electrode materials is 100 nm.

In an implementation mode of the disclosure, when the source/drain electrode materials in step (4) are Au, Al, Cu and other metals prepared by thermal evaporation, evaporation is performed at a current of 120 A for 30 min, and the thickness of the obtained electrode materials is 100 nm.

In an implementation mode of the disclosure, the IGZO device prepared in step (4) needs to be annealed at 500° C. for 1 h in a nitrogen environment to improve the device performance.

In an implementation mode of the disclosure, a method for preparing the IGZO-black phosphorus heterojunctions with different structures includes the following steps:

(1) preparing black phosphorus samples on substrates, and then finding and marking the samples of different thicknesses under an optical microscope; and (2) transferring the black phosphorus samples on the substrates in step (1) to the prepared IGZO device channels, and by regulating the relative position between the substrate and the black phosphorus, changing the contact mode and contact area between the black phosphorus and the IGZO device, thereby preparing IGZO-black phosphorus heterojunction structures with different structures.

In an implementation mode of the disclosure, the substrate in step (1) is a transparent thin film such as PDMS (polydimethylsiloxane), PET (polyethylene terephthalate), and PI (polyimide).

In an implementation mode of the disclosure, a method for preparing the black phosphorus samples in step (1) includes a micromechanical exfoliation method, a pulsed laser deposition method, a high pressure method, a ball milling method, a chemical vapor deposition method and a liquid phase exfoliation method.

In an implementation mode of the disclosure, the thickness of the black phosphorus samples in step (1) is 10 nm-100 nm.

In an implementation mode of the disclosure, the thickness of the black phosphorus samples in step (1) is 40 nm.

In an implementation mode of the disclosure, the IGZO-black phosphorus heterojunctions with different structures prepared by changing the contact mode between the black phosphorus and the IGZO device in step (2) include the following four structures:

(a) a black phosphorus sample with a size larger than the channel length of the IGZO device is selected and transferred to the surface of the device, the black phosphorus sample spans both ends of the IGZO channel, and such a structure is named as Type I;

(b) a black phosphorus sample with a size smaller than the channel length of the IGZO device is selected and transferred to the surface of the device, the black phosphorus sample only covers the IGZO channel and is not in contact with the source/drain electrodes, and such a structure is named as Type II;

(c) boron nitride samples as an insulating layer are prepared, samples with a thickness of equal to or less than 10 nm and different sizes are selected under a microscope, a boron nitride sample with the size larger than the channel length of the IGZO device is selected and transferred to both ends of the device channel first, and then the black phosphorus sample is transferred to the surface of the boron nitride sample, that is, direct contact between the black phosphorus sample and the IGZO is isolated, and such a structure is named as type III; and (d) a boron nitride sample prepared with a size exactly equal to the channel length of the IGZO device is selected and transferred to both ends of the device channel, that is, only in contact with the IGZO in the channel, but not in contact with the source/drain electrodes; then a black phosphorus sample with a size larger than the IGZO channel is selected and transferred to the surface of the device structure; in this type of device, the black phosphorus sample is only in contact with the source/drain electrodes at both ends of the IGZO device, but not in contact with the IGZO in the channel, and such a structure is named as Type IV.

In an implementation mode of the disclosure, a method for preparing the boron nitride samples is to prepare the boron nitride samples as the insulating layer on a PDMS substrate by the micromechanical exfoliation method.

The second objective of the disclosure is to regulate the photocurrent of IGZO devices by constructing the above IGZO-black phosphorus heterojunctions with different structures.

The third objective of the disclosure is to provide an IGZO-black phosphorus heterojunction prepared by the above construction method.

The fourth objective of the disclosure is to provide applications of the above IGZO-black phosphorus heterojunction in thin film transistors, display technology, flexible wearable electronic technology and new sensing technology.

[Technical Effects]:

(1) The disclosure is based on a two-dimensional material black phosphorus, and regulates the photocurrent of IGZO devices by constructing IGZO-black phosphorus heterojunctions with different structures. Compared with the traditional methods including changing electrodes, changing IGZO morphology and changing device structures, a preparation process of the disclosure is simple, the black phosphorus, boron nitride and other materials are directly attached to the IGZO device channel, and no secondary sputtering or evaporation is performed, thereby avoiding introduction of defects or secondary damage to the sample.

(2) The disclosure uses the P-type doping property of intrinsic black phosphorus and the N-type doping property of IGZO to prepare a vertical P—N heterostructure, and prepares a PN junction by different intrinsic doping concentrations of the two materials. The process is simple, highly universal, and highly repeatable. The thickness of the black phosphorus is 10 nm or more, and the formed PN structure has high stability.

(3) In the disclosure, the black phosphorus sample is in contact with the IGZO by Van der Waals force. Driven by external conditions (voltage, illumination, etc.), transfer of charges is easy to realize, and regulation of the width of a space charge region of a PN junction is conducive to the formation and regulation of photocurrent.

(4) In the disclosure, by changing the contact mode between the black phosphorus sample and the IGZO channel, and at the same time using absorption by the black phosphorus sample in a near-infrared band, the photocurrent intensity and response time of IGZO under laser light of different wavelengths are effectively regulated. Moreover, by changing the contact mode between the black phosphorus sample and the IGZO channel, the photocurrent intensity can completely disappear, decrease, and increase.

(5) In the disclosure, the IGZO device is designed by masks, and the black phosphorus sample is transferred by a dry transfer technology, and the technology is simple in operation, highly repeatable, and easy to realize large-area and multi-device integration.

(6) In the disclosure, the interface between the IGZO and the black phosphorus heterojunction is smooth, both samples have very good flexibility, and this can realize preparation of flexible multi-junction devices.

DETAILED DESCRIPTION

If specific conditions are not indicated in an example, it is carried out according to conventional conditions or conditions suggested by a manufacturer. Reagents or instruments used without the manufacturers indicated are commercially available conventional products.

Example 1

Figure 1A:
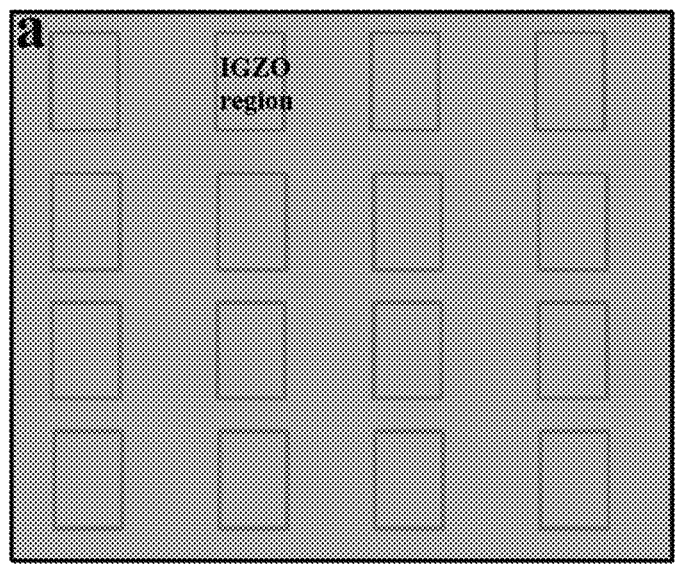
FIG. 1A is a schematic diagram of a mask for magnetron sputtering of IGZO, and the block part is an IGZO area map.
Figure 1B:
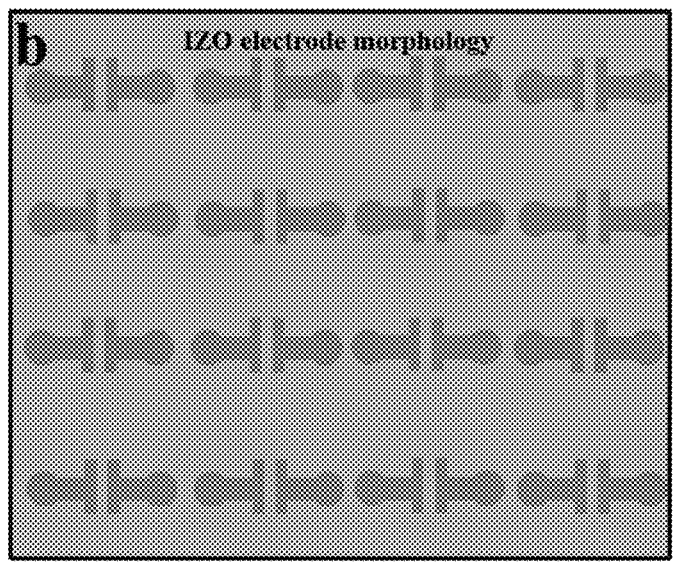
FIG. 1B is a schematic diagram of a mask for magnetron sputtering of electrode IZO.
Figure 1C:
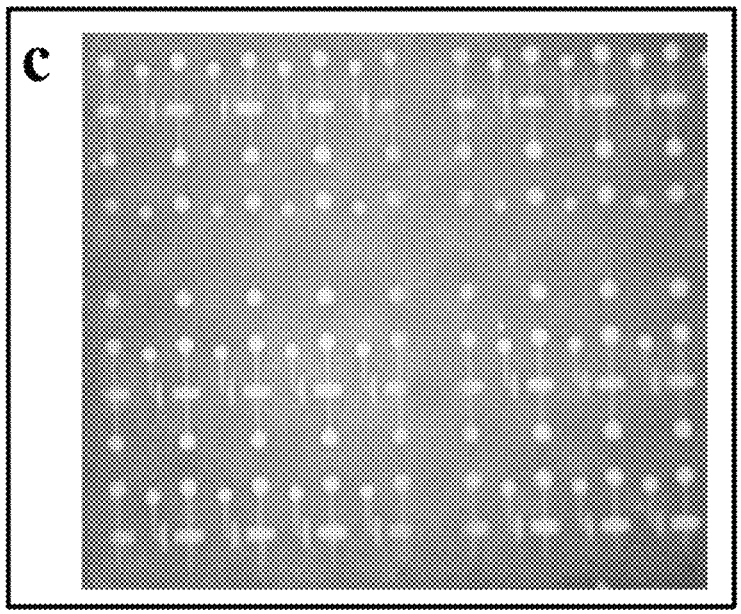
FIG. 1C is a physical image of an IGZO device obtained after performing magnetron sputtering twice.
Figure 1D:
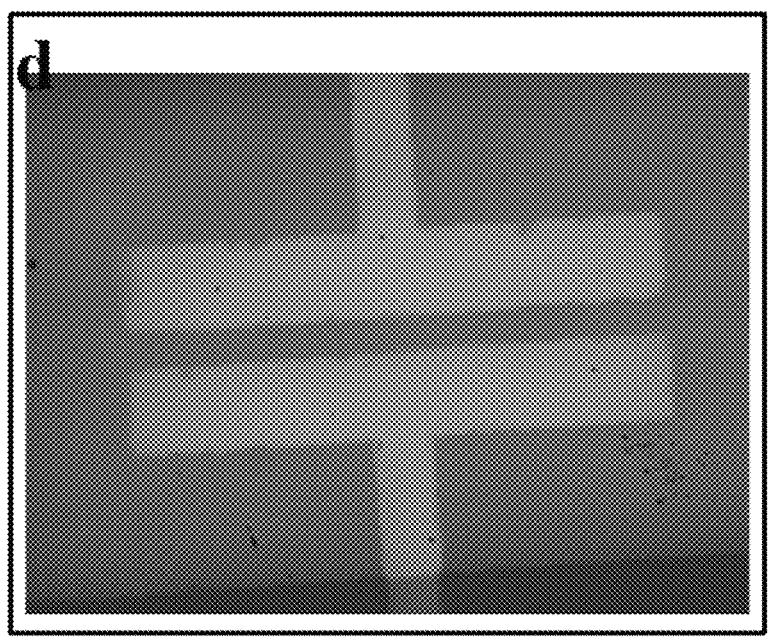
FIG. 1D is an optical microscope image (under a 10× lens) of the prepared IGZO device.

Based on FIG. 1, an IGZO device was prepared by using masks by a preparation process including the following steps:

(1) Preparation of the masks: The masks were drawn as required by the experiment (as shown in FIG. 1A and FIG. 1B). In the present example, a set of masks was used, one kind was used to prepare an IGZO channel layer (mask I), and the other kind was used to prepare electrodes on the surface of IGZO (mask II). The channel width of the mask I was 40 um, and the masks were processed by a mask preparation manufacturer (the manufacturer in the present example was Micro-nano Scientific Research and Experimental Equipment Company). To ensure the flatness and small thickness of the masks, the original material used was a stainless steel plate with a thickness of 3 mm.

(2) Substrate cleaning: In the present example, a silicon wafer plated with a 300 nm silicon dioxide layer was used as a substrate, and the substrate was sequentially ultrasonically cleaned in acetone, ethanol, and deionized water for 5 min each at an ultrasonic frequency of 25 KHz to remove surface organic matter. Then the substrate was blown dry with a nitrogen gun, and finally baked on a heating platform at 350° C. for 30 min to remove acetone, ethanol and other residues.

(3) A stainless steel mask was fixed by a fixture on a pre-cut substrate surface with the same size as the mask. By controlling the fixture, the mask was in close contact with the substrate to avoid IGZO infiltrated into a channel in a magnetron sputtering process. The IGZO was deposited by a magnetron sputtering method, the substrate with the fixed mask was put in a magnetron sputtering cavity, and the cavity was evacuated to a vacuum degree equal to or less than 10 Pa. Then, argon and oxygen were introduced at flow rates of 10 mL/min and 0.3 mL/min respectively, and the reaction was performed at a pressure of 400 mPa and a sputtering power of 1.76 W/cm$^2$ for 3 min, thereby preparing an IGZO channel with a thickness of 10 nm and a width of 40 um.

(4) Preparation of electrodes: In the present example, electrode materials of the IGZO device were IZO prepared by a magnetron sputtering method. First, the electrode mask was attached to the IGZO-plated substrate under a microscope, fixed with a fixture, and put into a magnetron sputtering cavity, and the cavity was evacuated to equal to or less than 10 Pa. Then, argon with a gas flow rate of 10 mL/min was introduced, and the reaction was performed at a pressure of 400 mPa and a sputtering power of 1.76 W/cm$^2$ for 10 min, thereby preparing a transistor device with IZO source/drain electrodes with a thickness of 100 nm. The overall morphology of the device was shown in FIG. 1C, and the microscopic morphology was shown in FIG. 1D.

(5) Device treatment: To improve the device performance, the structure prepared in step (4) was annealed at 500° C. for 1 h in a nitrogen atmosphere.

Figure 2A:
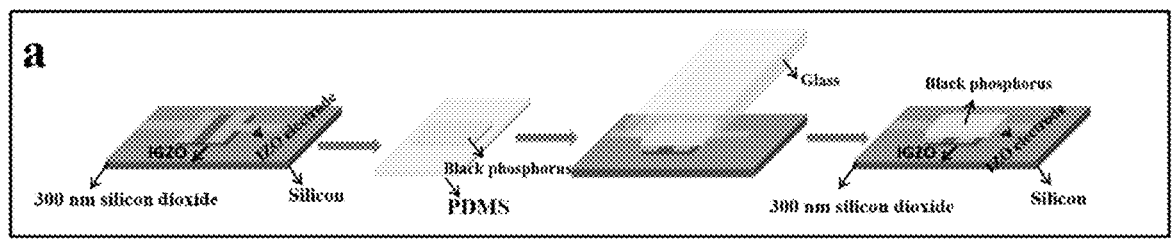
FIG. 2A is a flow chart, from left to right, of transferring a black phosphorus sample to an IGZO device channel using PDMS.
Figure 2B:
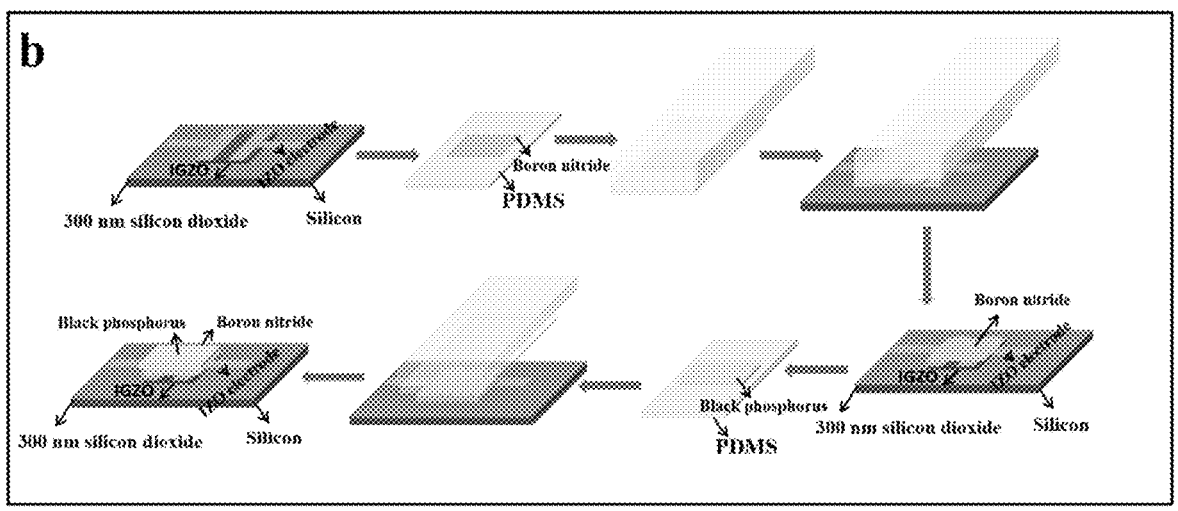
FIG. 2B, along the arrow direction, a boron nitride sample is firstly transferred to an IGZO device channel by PDMS, and then a black phosphorus sample is transferred to the surface of the IGZO device with the boron nitride attached.

Based on FIG. 2A and FIG. 2B, black phosphorus-IGZO heterojunctions with different structures were prepared by a preparation process including the following steps:

(1) Preparation of black phosphorus samples: The black phosphorus samples were prepared by a mechanical exfoliation method, with the specific steps as follows: firstly, some samples on the surfaces of black phosphorus crystals were adhered to 3M tapes, and then the tapes were torn against each other. The operation was repeated about ten times until the samples left on the tapes turned gray, and the tapes were attached to the surface of a PDMS substrate, and lifted off after standing for half an hour, leaving black phosphorus samples with different thicknesses on the surface of the substrate. The PDMS substrate used was self-prepared as follows: first Dow Corning SYLGARD 184 silicone rubber and a curing agent were mixed in a weight ratio of 10:1, and stirred evenly. After all bubbles disappeared, the mixture was allowed to stand in a refrigerator (4° C.) for 48 h to solidify into a transparent thin film.

Figure 3A:
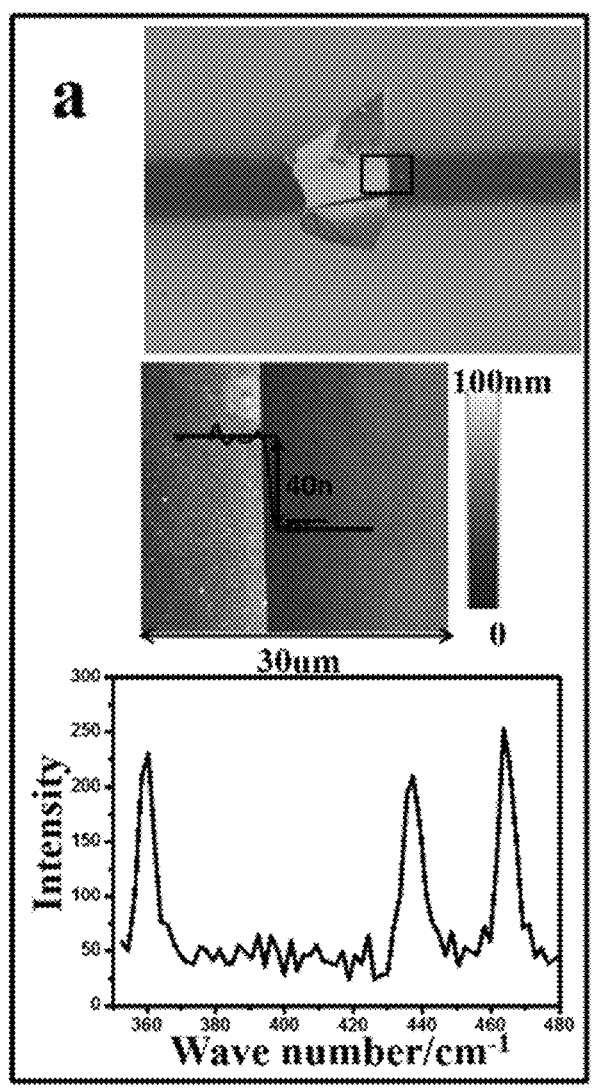
FIG. 3A shows optical microscope, Raman and AFM characterizations of the Type I heterojunction structure in Example 1.

(2) Preparation of a black phosphorus-IGZO heterojunction sample (type I): The black phosphorus-IGZO heterojunction was prepared by dry transfer technology. First, an IGZO device was found under an optical microscope and located at both ends of a channel. Then, a PDMS substrate with black phosphorus of a larger size (greater than the channel width of the device) attached was fixed to a glass substrate, and the black phosphorus sample to be transferred was located by a three-dimensional translation stage under the microscope. Finally, the IGZO device was gradually moved vertically upward until the black phosphorus was completely attached to both ends of the channel, forming the structure shown in FIG. 3A.

Figure 3B:
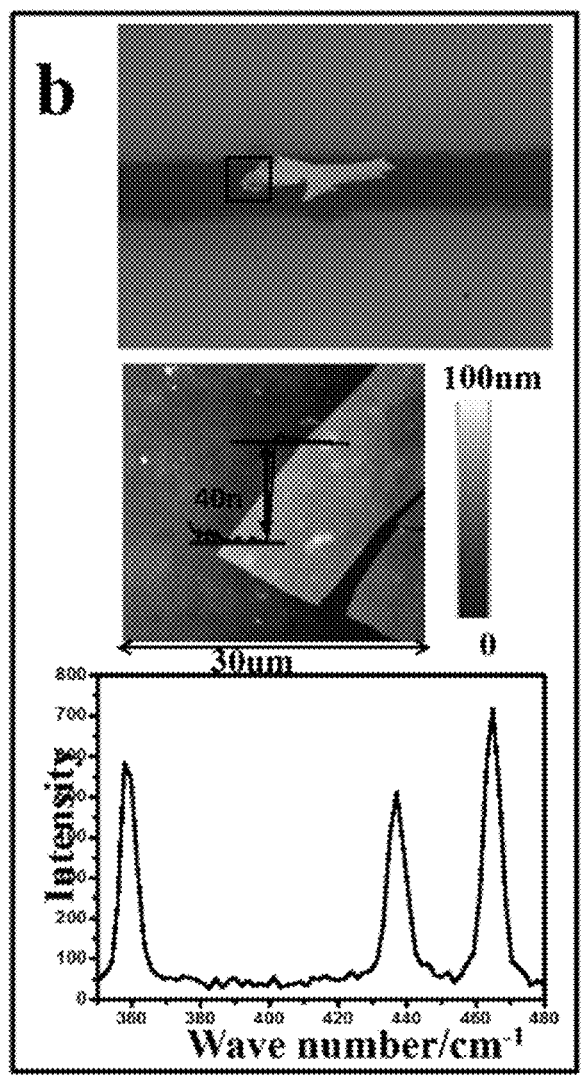
FIG. 3B shows optical microscope, Raman and AFM characterizations of the Type II heterojunction structure in Example 1.

(3) Preparation of a black phosphorus-IGZO heterojunction sample (type II): First, an IGZO device was found under an optical microscope and located in the middle of a channel. Then, a PDMS substrate with black phosphorus of a smaller size (smaller than the channel width of the device) attached was fixed to a glass substrate, and the black phosphorus sample to be transferred was located by a three-dimensional translation stage under the microscope. Finally, the IGZO device was gradually moved vertically upward until the black phosphorus was completely attached to the middle of the channel, forming the structure shown in FIG. 3B.

Figure 3C:
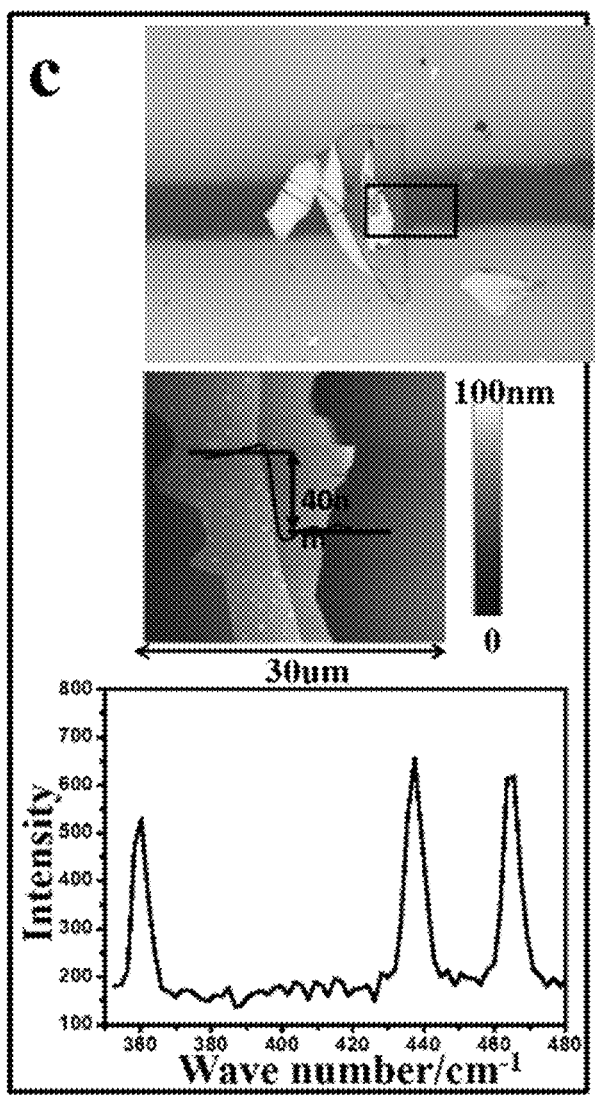
FIG. 3C shows optical microscope, Raman and AFM characterizations of the Type III heterojunction structure in Example 1.

(4) Preparation of a black phosphorus-boron nitride-IGZO heterojunction sample (type III): In a first step: first, an IGZO device was found under an optical microscope and located at both ends of a channel; then, a PDMS substrate with boron nitride of a larger size (greater than the channel width of the device) attached was fixed to a glass substrate, and the boron nitride sample to be transferred was located by a three-dimensional translation stage under the microscope; and then, the IGZO device was gradually moved vertically upward until the boron nitride was completely attached to both ends of the channel. In a second step: first, the boron nitride-IGZO heterostructure prepared in the first step was found under an optical microscope; then, a PDMS substrate with a black phosphorus sample attached was fixed to a glass substrate, and the black phosphorus sample to be transferred was located by a three-dimensional translation stage under the microscope; and finally, the IGZO device with the boron nitride attached was gradually moved vertically upward until the black phosphorus was completely attached to the middle of the channel, forming the structure shown in FIG. 3C.

Figure 3D:
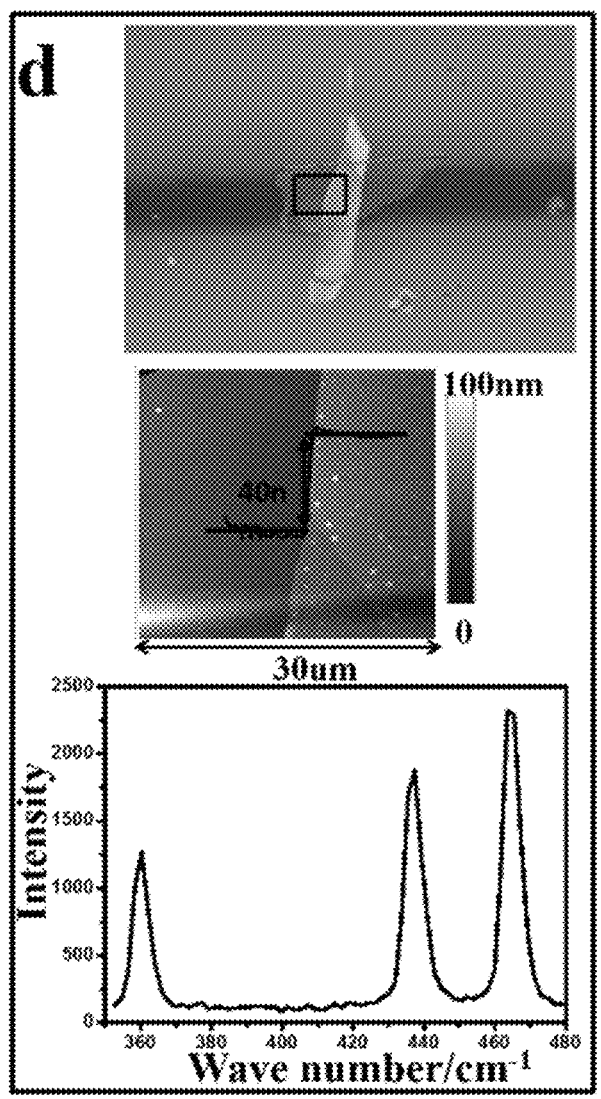
FIG. 3D shows optical microscope, Raman and AFM characterizations of the Type IV heterojunction structure in Example 1.

(5) Preparation of a black phosphorus-boron nitride-IGZO heterojunction sample (type IV): In a first step: first, an IGZO device was found under an optical microscope and located at both ends of a channel; then, a PDMS substrate with boron nitride of a specific size (a length equal to the channel width of the device) attached was fixed to a glass substrate, and the boron nitride sample to be transferred was located by a three-dimensional translation stage under the microscope; and then, the IGZO device was gradually moved vertically upward until the boron nitride was completely attached to both ends of the channel. In a second step: first, the boron nitride-IGZO heterostructure prepared in the first step was found under an optical microscope; then, a PDMS substrate with a black phosphorus sample having a larger size (a length greater than the channel width of IGZO) attached was fixed to a glass substrate, and the black phosphorus sample to be transferred was located by a three-dimensional translation stage under the microscope; and finally, the IGZO device with the boron nitride attached was gradually moved vertically upward until the black phosphorus was completely attached to both sides of the channel, forming the structure shown in FIG. 3D.

Optical Microscope, Raman and AFM Characterizations of Above Different Heterostructures Optical microscope images of the four different heterostructures were in the top line in FIG. 3A, FIG. 3B, FIG. 3C, and FIG. 3D, and the graphs were obtained by putting a sample under an optical microscope (LEICA DM2700), focusing a tenfold lens clearly, then performing imaging using a CCD of the microscope, and taking pictures with software (LC3.0-U2).

Through AFM characterization, the thickness of the black phosphorus samples used was all 40 nm, as shown in the middle line of FIG. 3A, FIG. 3B, FIG. 3C, and FIG. 3D. During the test, a sample was placed under an AFM (Bruker Dimension Fastscan) probe, and then scanned in a semi-contact mode to obtain a surface morphology map. Two lines with different heights were obtained by drawing lines on the black phosphorus surface and the substrate surface, and the height between the lines was the thickness of the black phosphorus sample.

The samples were subjected to Raman characterization, and the results were shown in the bottom line in FIG. 3A, FIG. 3B, FIG. 3C, and FIG. 3D. During the test, a sample was placed under the lens of a Raman spectrometer (Renishaw LabRAM Inviamicro), 532 nm laser light was turned on to illuminate the surface of the sample, light splitting was performed using a 1800 g/mm grating, and Raman signals of the sample was collected by the spectrometer. It can be seen that the black phosphorus samples have three typical Raman peaks at 360 cm', 440 $cm^{-1}$ and 470 $cm^{-1}$ respectively, corresponding to different vibration modes in the internal structure of black phosphorus.

Figure 4:
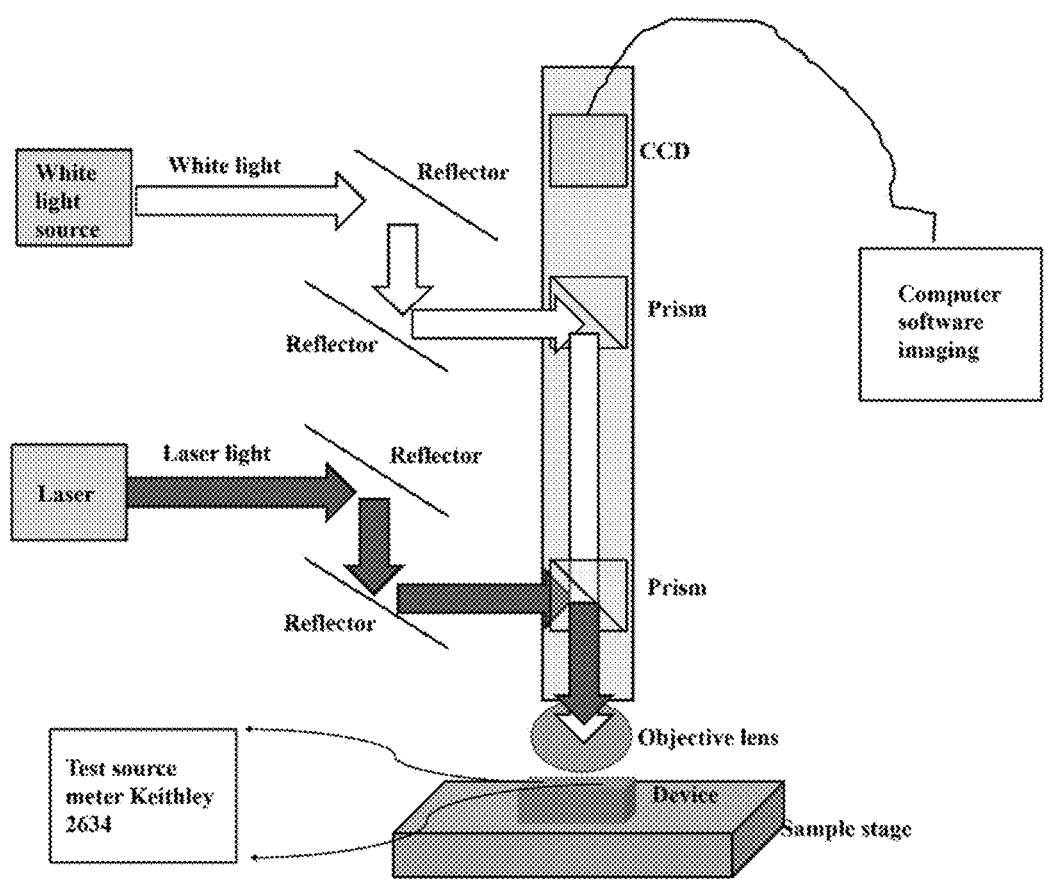
FIG. 4 is a schematic diagram of a laser light path used in a photocurrent test.

Characterization of Photocurrent Performance of Different Types of Heterojunctions:

A laser light path used in a photocurrent test was self-built. Laser light from a laser was reflected by reflectors, prisms, etc., and finally hit a sample to be tested through a lens. A schematic diagram of the test optical path was shown in FIG. 4, and photocurrent was collected using a Keithley 2634 test source meter. A specific method of the test was as follows: first, an optical path lens was positioned to a certain point in a channel of a pure IGZO device, and the point was positioned by the distances from both sides of the channel; then a 447 nm laser light source was turned on, the laser light hit the positioned point, the switch of the laser was controlled using a chopper, and change of the photocurrent was collected; different types of black phosphorus-IGZO heterostructures were prepared by dry transfer technology, and black phosphorus or boron nitride did not cover the positioned point; and finally, change of the photocurrent at the same point after transferring a heterojunction was tested by the same test method as above.

The characterization results were shown in FIG. 5. The results showed that when only the black phosphorus sample was placed on both ends of the channel of the IGZO device (type I), the photocurrent in the same region of the original IGZO almost completely disappeared (see FIG. 5A); when the black phosphorus sample only covered the channel and was not in contact with the electrodes at both ends (type II), the photocurrent in the same region of the original IGZO only decreased in a small range, and did not disappear completely (see FIG. 5B); when the boron nitride thin film was first transferred to the channel of the IGZO device, and then the black phosphorus sample was transferred and entirely attached to the boron nitride surface (type III), the photocurrent in the same region of the original IGZO increased significantly (see FIG. 5C); and when the boron nitride thin film was transferred to the channel of the IGZO device first, and then the black phosphorus sample was transferred but was only in contact with the electrodes on both sides (type IV), the photocurrent in the same region of the original IGZO increased slightly (see FIG. 5D). The results showed that the photocurrent in the IGZO can disappear or gradually increase by regulating the contact mode between the IGZO and the black phosphorus, and the photocurrent can be effectively regulated.

Example 2 Changing Channel Width of IGZO

An IGZO device was prepared using masks:
(1) Preparation of masks: Different from the masks in Example 1, the channel width of masks I in the present example was 80 um; and the materials and processing manufacturers were the same.
(2)-(5): By the same steps (2)-(5) as in Example 1, an IGZO device with a channel width of 80 um was prepared. Four types of black phosphorus-IGZO heterojunctions with different structures were prepared by the same preparation method as in Example 1.

Characterization of photocurrent performance of different types of heterojunctions (Type I and Type III): Photocurrent was tested by the test method in Example 1.

Figure 6A:
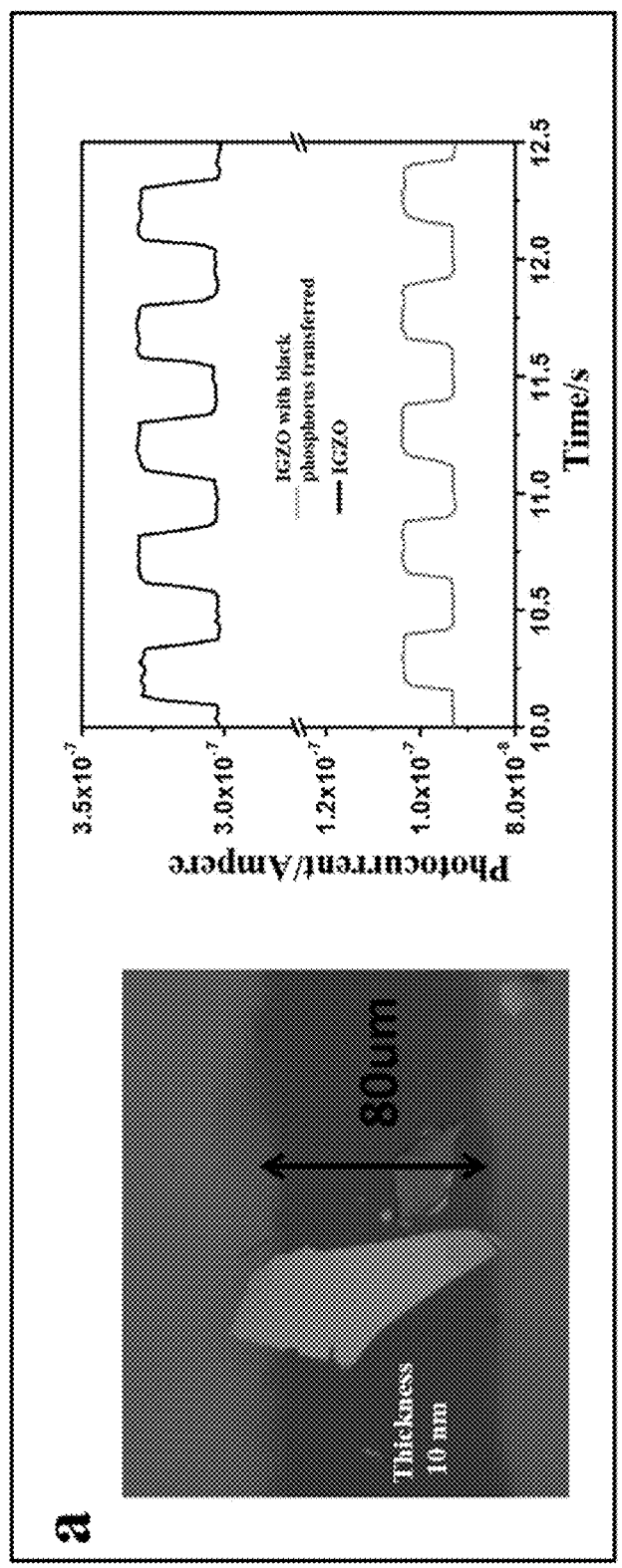
FIG. 6A is a graph showing characterization of optoelectronic performance of a type I IGZO-black phosphorus heterojunction in Example 2 under a laser light with a wavelength of 447 nm.
Figure 6B:
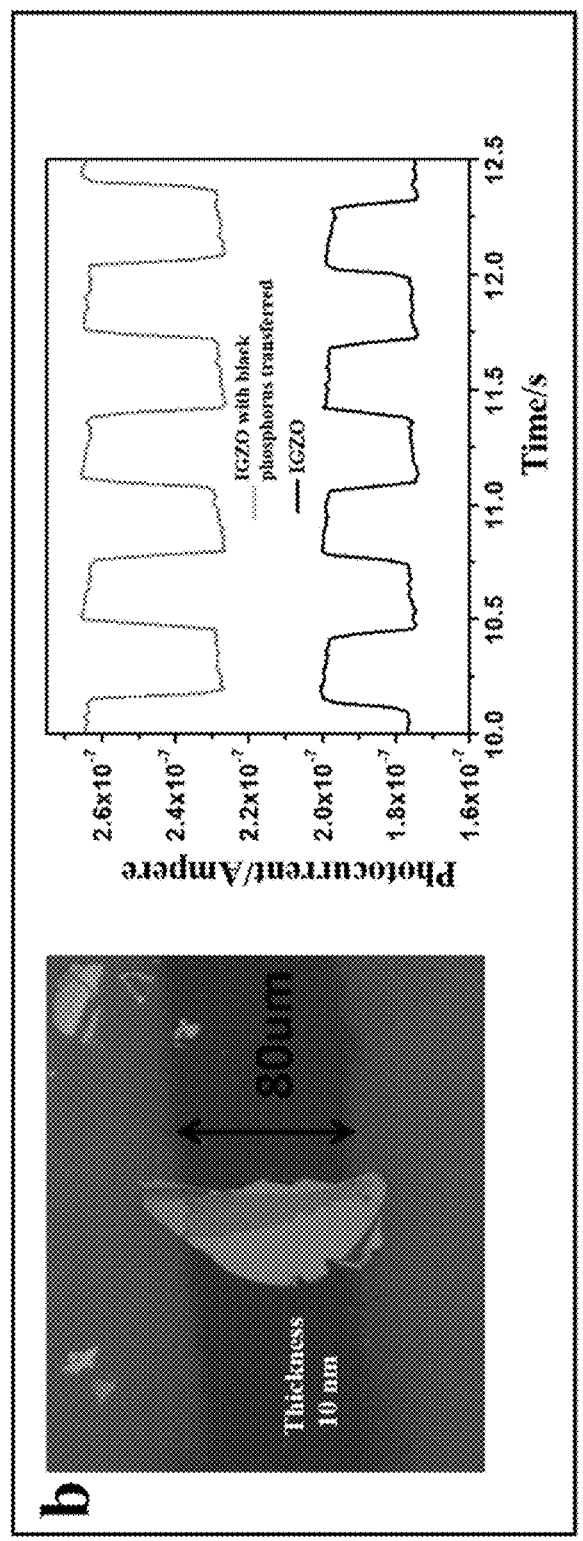
FIG. 6B is a graph showing characterization of optoelectronic performance of a type III IGZO-black phosphorus heterojunction in Example 2 under a laser light with a wavelength of 447 nm.

The test results were shown in FIG. 6A and FIG. 6B. In Type I, that is, after the black phosphorus covered the electrodes at both ends of the channel, the photocurrent in the original IGZO decreased, but the decrease was not significant (see FIG. 6A). In type III, that is, when the boron nitride thin film was first transferred to the channel of the IGZO device, and then the black phosphorus sample was transferred and entirely attached to the surface of the boron nitride, the photocurrent in the original IGZO increased, but the increase was not significant (see FIG. 6B). Compared with the same types of heterostructures in Example 1, it was found that the regulation effect of the photocurrent of the IGZO with this channel width was not very good.

Example 3 Changing Channel Thickness of IGZO (1)-(2): Same as steps (1)-(2) in Example 1.
(3): A stainless steel mask was fixed by a fixture on a pre-cut substrate surface with the same size as the mask. By controlling the fixture, the mask was in close contact with the substrate to avoid IGZO infiltrated into a channel in a magnetron sputtering process. The IGZO was deposited by a magnetron sputtering method, the substrate with the fixed mask was put in a magnetron sputtering cavity, and the cavity was evacuated to a vacuum degree equal to or less than 10 Pa. Then, argon and oxygen were introduced at flow rates of 10 mL/min and 0.3 mL/min respectively, and the reaction was performed at a pressure of 400 mPa and a sputtering power of 1.76 W/cm$^2$ for 12 min, thereby preparing an IGZO channel with a thickness of 40 nm.
(4)-(5): Same as in Example 1.

Preparation of black phosphorus-IGZO heterojunctions with different structures: By the same preparation method as in Example 1, type I and type III black phosphorus-IGZO heterojunction structures were prepared.

Characterization of photocurrent performance of different types of heterojunctions: Photocurrent was tested by the test method in Example 1.

Figure 7A:
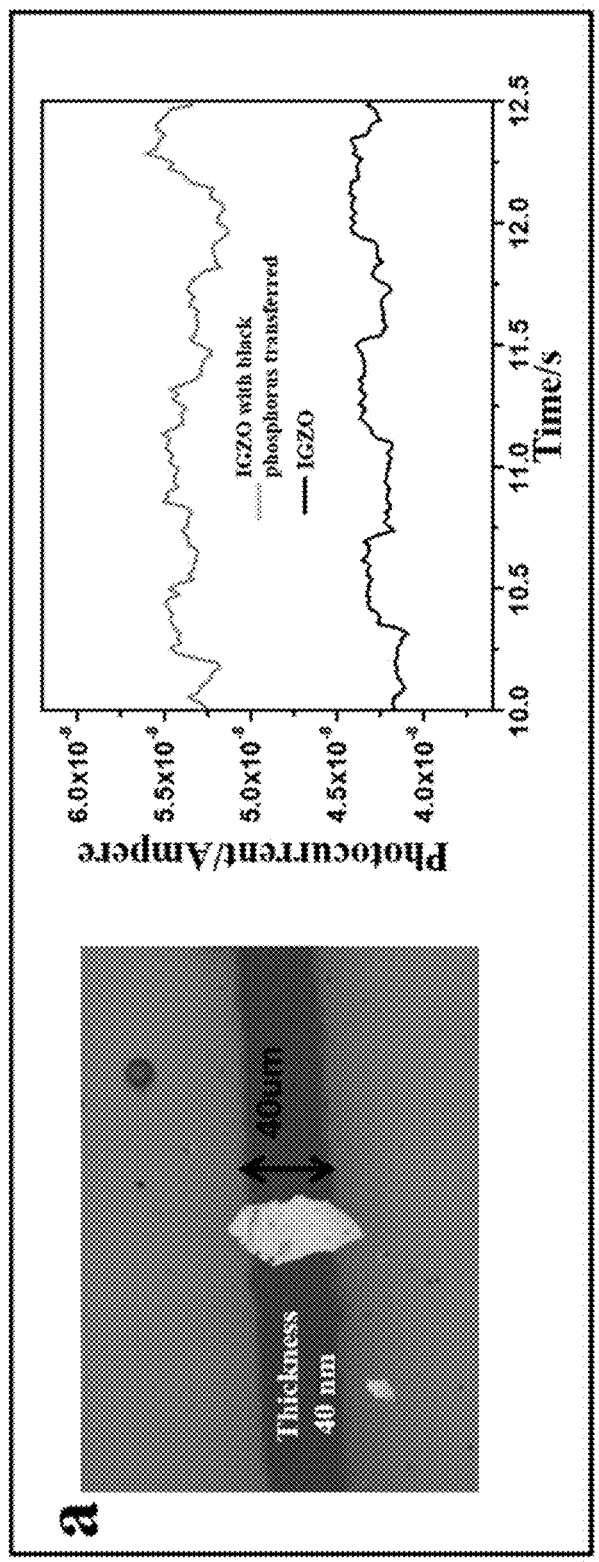
FIG. 7A is a graph showing characterization of optoelectronic performance of a type I IGZO-black phosphorus heterojunction in Example 3 under a laser light with a wavelength of 447 nm.
Figure 7B:
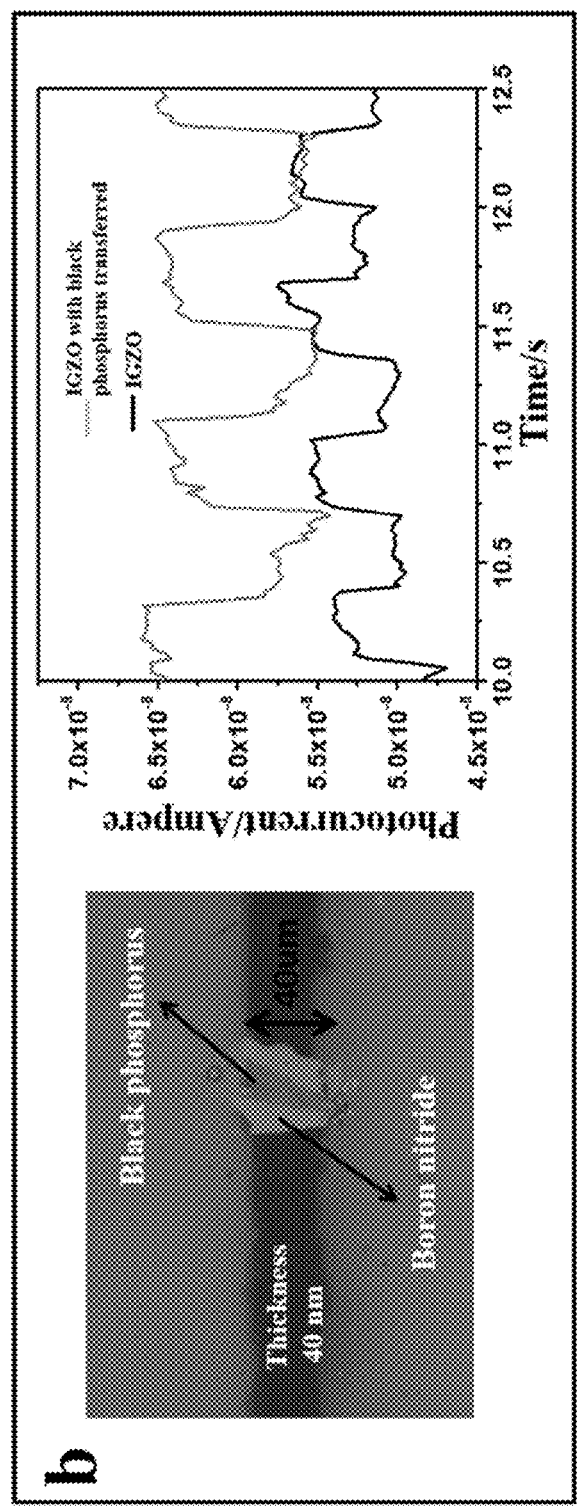
FIG. 7B is a graph showing characterization of optoelectronic performance of a type III IGZO-black phosphorus heterojunction in Example 3 under a laser light with a wavelength of 447 nm.

The test results were shown in FIG. 7A and FIG. 7B. The original photocurrent effect of the IGZO with a thickness of 40 nm was not good, and had large noise. In the type I heterojunction, although the photocurrent decreased slightly, as shown in FIG. 7A, it could not completely disappear. In the type III heterojunction, the photocurrent hardly increased (see FIG. 7B). Therefore, for the IGZO device with a thickness of 40 nm, the heterostructure cannot effectively control the photocurrent thereof.

Example 4 Changing Thickness of Black Phosphorus (1)-(5): Same as steps (1)-(5) in Example 1.
Preparation of black phosphorus-IGZO heterojunctions: By the same preparation method as in Example 1, type II and type III heterojunctions with black phosphorus thicknesses of 5 nm and 10 nm were prepared.

Characterization of photocurrent performance of different types of heterojunctions: Photocurrent was tested by the test method in Example 1.

Figure 5A:
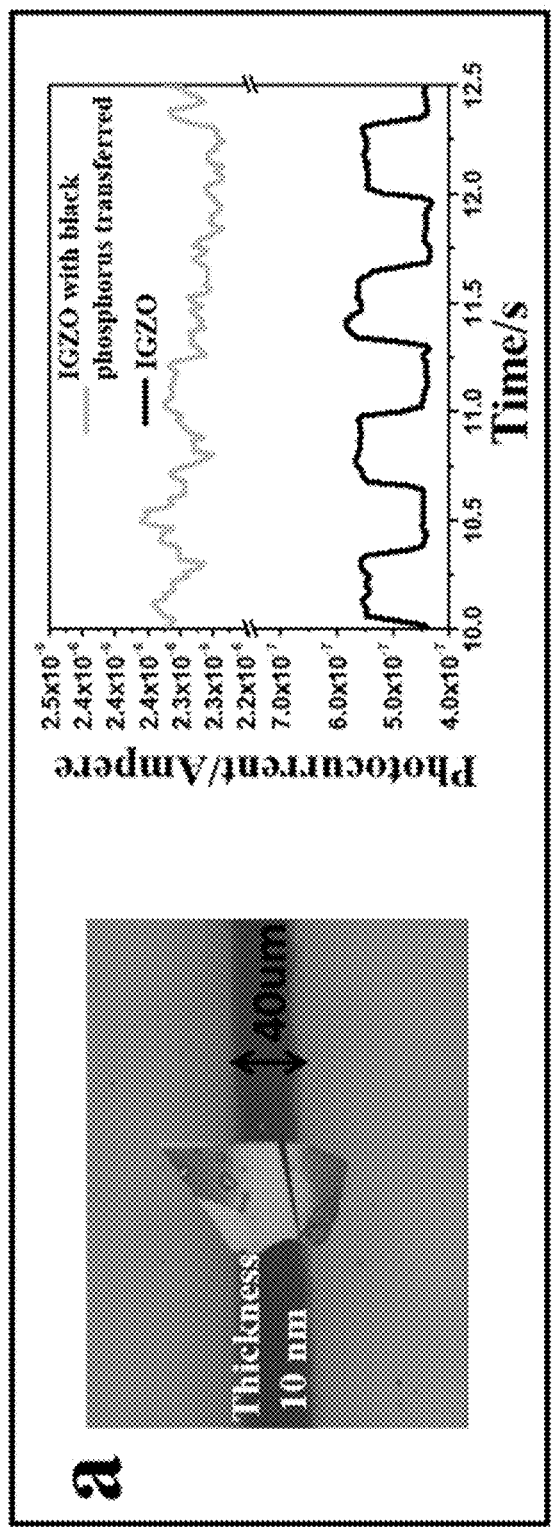
FIG. 5A is a graph showing characterization of optoelectronic performance of a type I IGZO-black phosphorus heterojunction in Example 1 under a laser light with a wavelength of 447 nm.
Figure 5B:
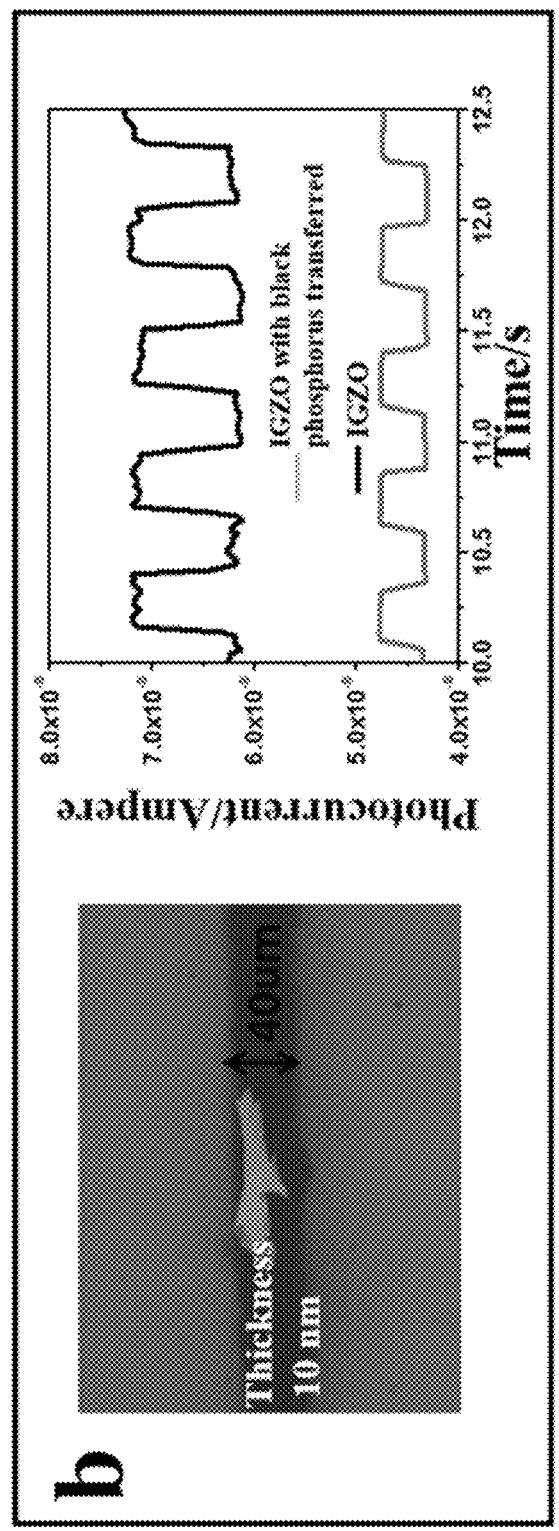
FIG. 5B is a graph showing characterization of optoelectronic performance of a type II IGZO-black phosphorus heterojunction in Example 1 under a laser light with a wavelength of 447 nm.
Figure 5C:
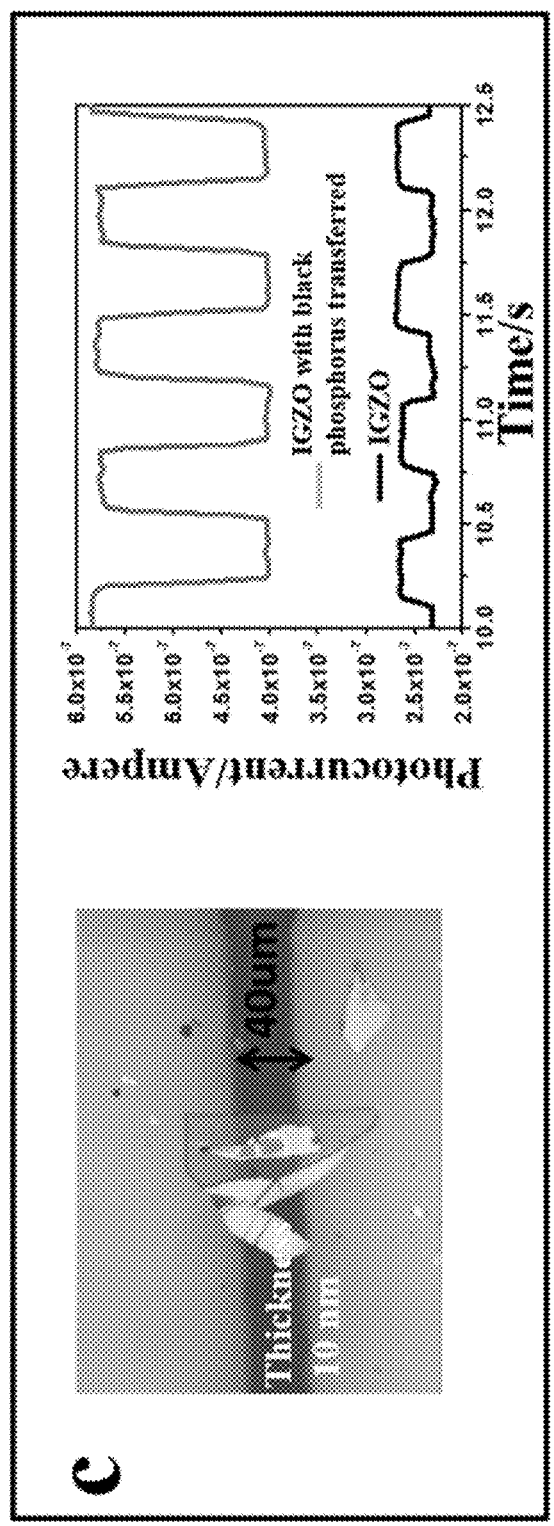
FIG. 5C is a graph showing characterization of optoelectronic performance of a type III IGZO-black phosphorus heterojunction in Example 1 under a laser light with a wavelength of 447 nm.
Figure 5D:
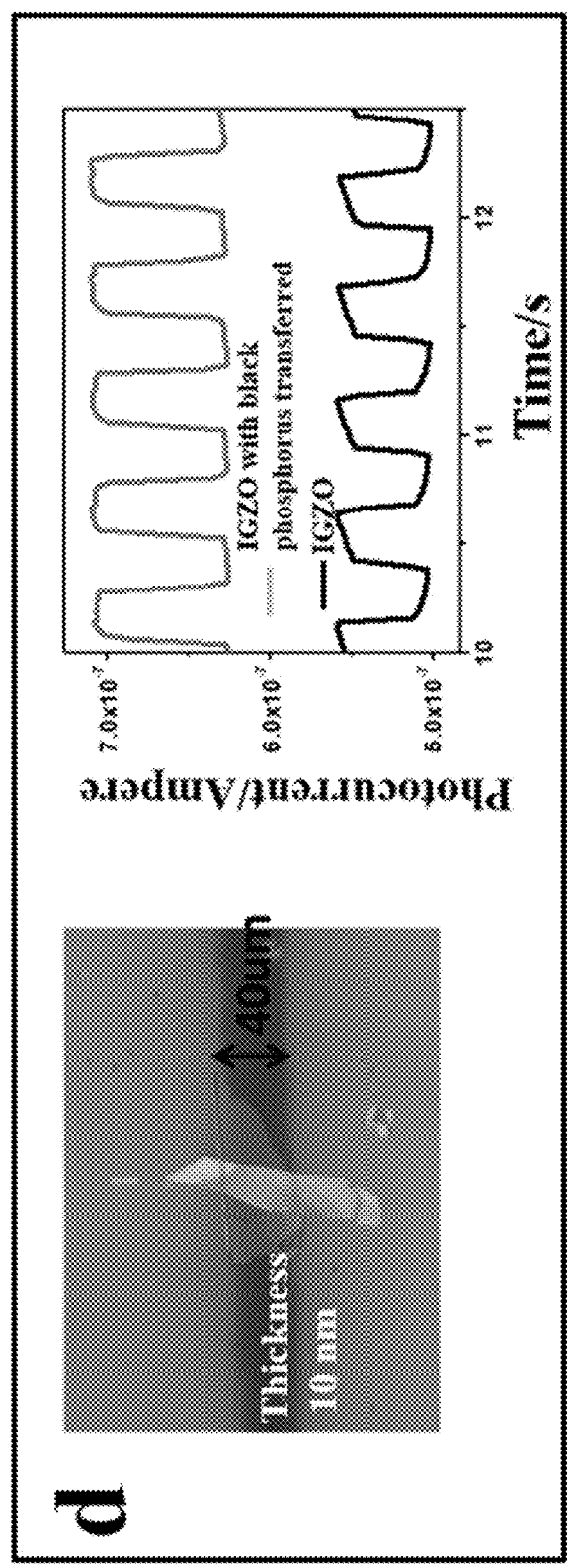
FIG. 5D is a graph showing characterization of optoelectronic performance of a type IV IGZO-black phosphorus heterojunction in Example 1 under a laser light with a wavelength of 447 nm.
Figure 8A:
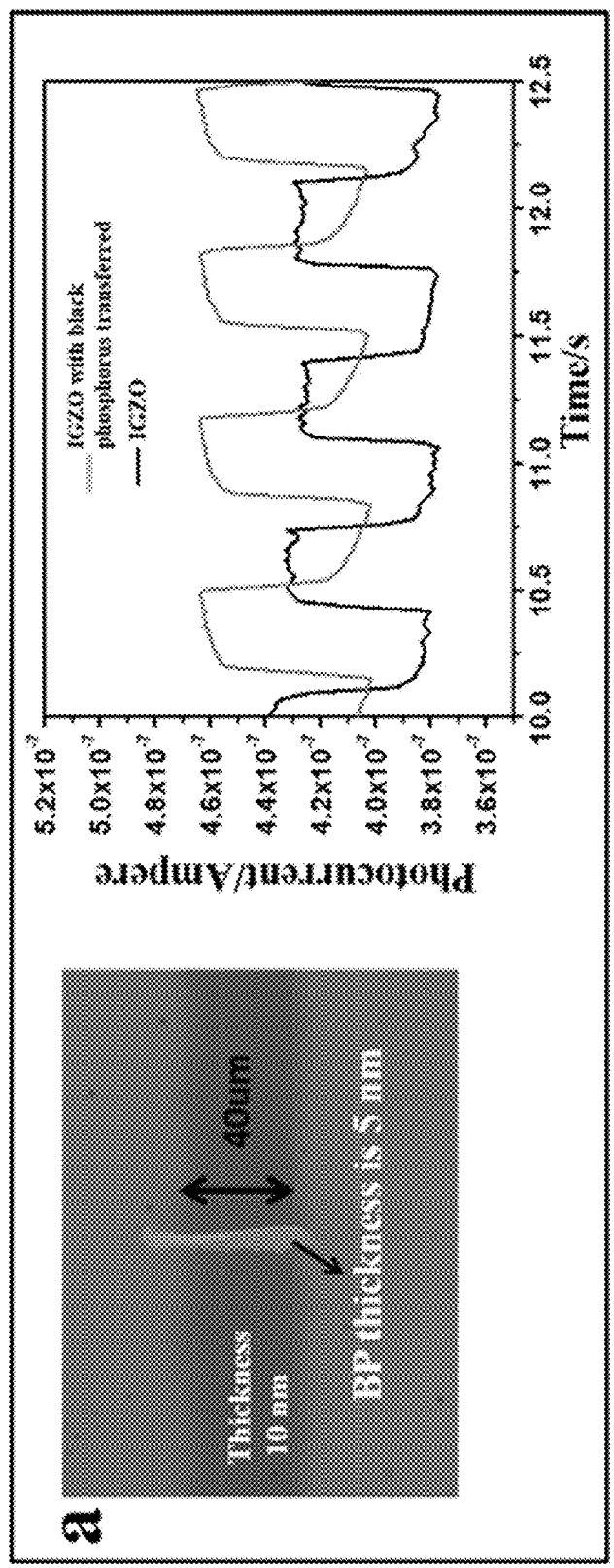
FIG. 8A is a graph showing characterization of optoelectronic performance of a type I IGZO-black phosphorus heterojunction with a thickness of 5 nm in Example 4 under a laser light with a wavelength of 447 nm.
Figure 8B:
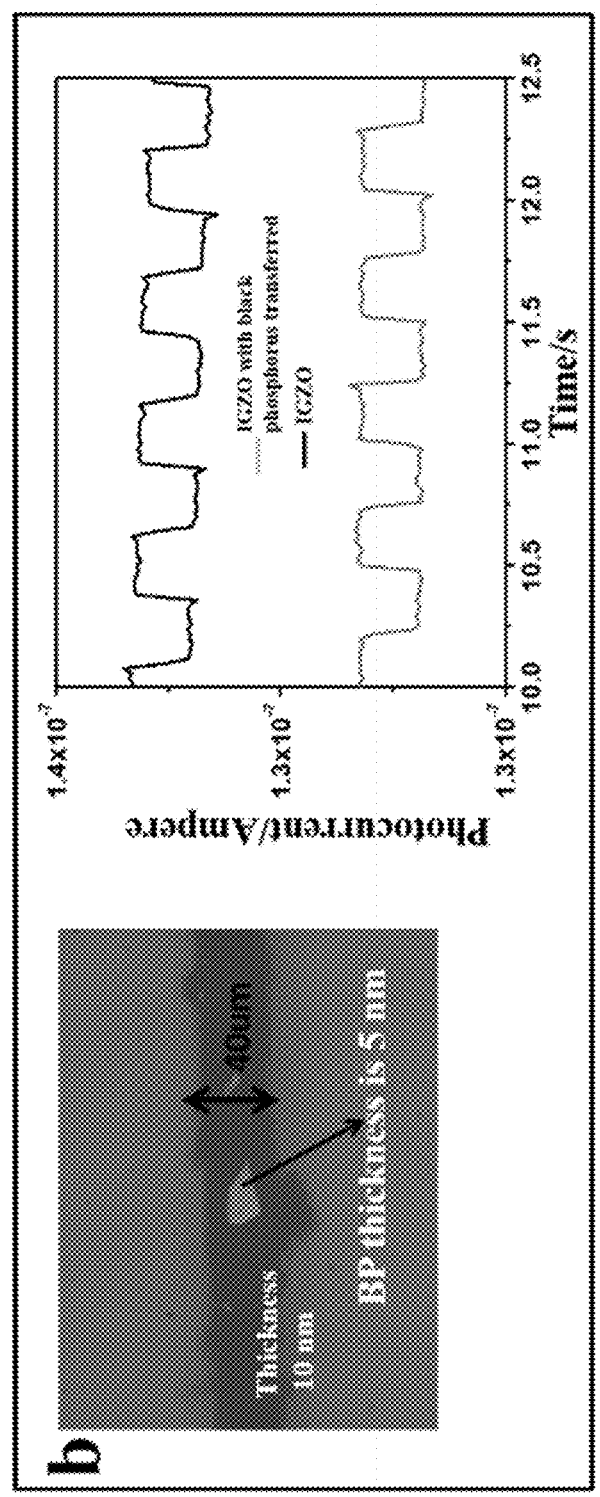
FIG. 8B is a graph showing characterization of optoelectronic performance of a type III IGZO-black phosphorus heterojunction with a thickness of 5 nm in Example 4 under a laser light with a wavelength of 447 nm.
Figure 8C:
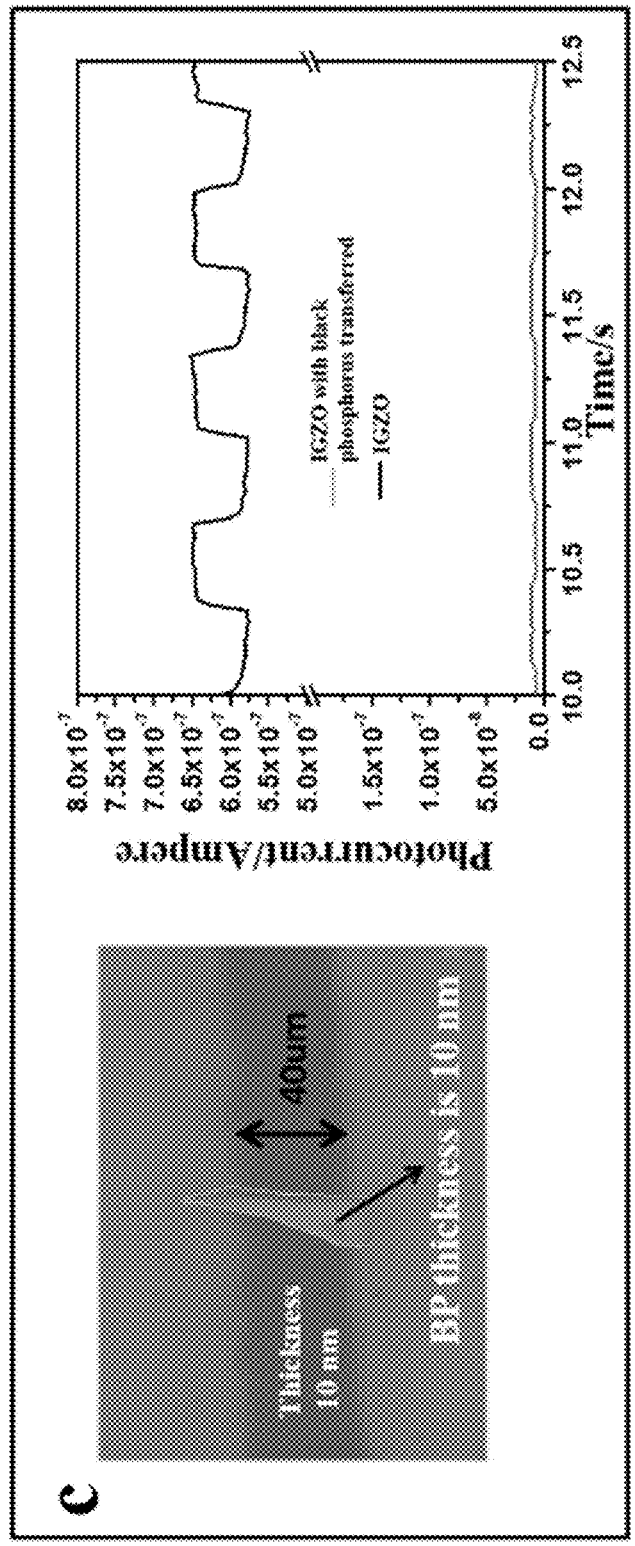
FIG. 8C is a graph showing characterization of optoelectronic performance of a type I IGZO-black phosphorus heterojunction with a thickness of 10 nm in Example 4 under a laser light with a wavelength of 447 nm.
Figure 8D:
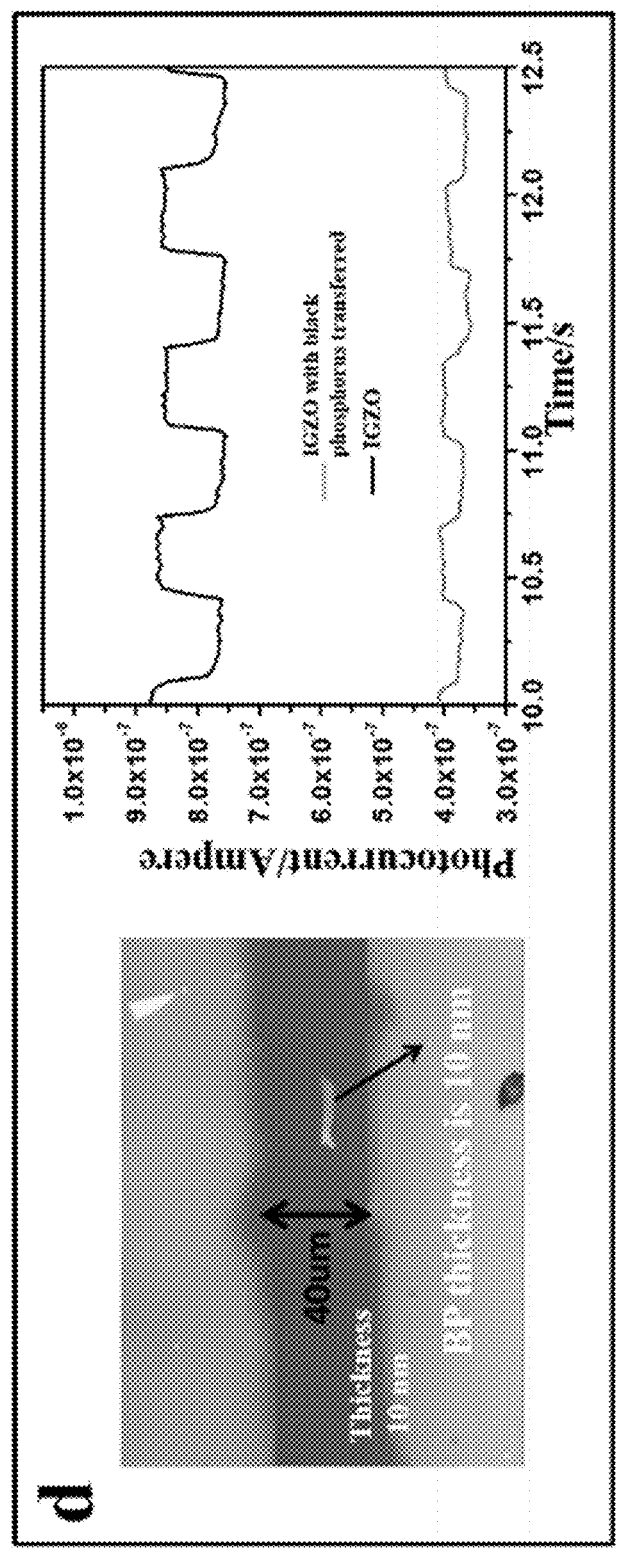
FIG. 8D is a graph showing characterization of optoelectronic performance of a type III IGZO-black phosphorus heterojunction with a thickness of 10 nm in Example 4 under a laser light with a wavelength of 447 nm.

The test results were shown in FIG. 8A, FIG. 8B, FIG. 8C, and FIG. 8D. FIG. 8A and FIG. 8B showed two types of heterojunctions (type I and type III) constructed with black phosphorus with a thickness of 5 nm, and it can be seen from the results that the photocurrent of the IGZO basically did not change after the heterojunction was constructed. FIG. 8C and FIG. 8D showed two types of heterojunctions (type I and type III) constructed with black phosphorus with a thickness of 10 nm, and from the results, it can be seen that the regulation effect was similar to that of 40 nm black phosphorus (FIG. 5A and FIG. 5B). The results showed that black phosphorus with a thickness of less than 10 nm cannot realize regulation of photocurrent of IGZO.

Although the disclosure has been disclosed as above with preferred examples, it is not intended to limit the disclosure. Anyone skilled in the art can make various changes and modifications without departing from the spirit and scope of the disclosure. Therefore, the protection scope of the disclosure should be defined by the claims.

What is claimed is:
1. A method, comprising:
   transferring a black phosphorus layer onto an indium gallium zinc oxide (IGZO) device, the IGZO device comprising an IGZO film supported on a substrate and a source electrode and a drain electrode both in electrical contact with the IGZO film, with a channel of the IGZO film separating the source electrode and the drain electrode;
   wherein the black phosphorus layer spans the channel and contacts both the source electrode and the drain electrode; or
   the black phosphorus layer is entirely in the channel and is not in contact with the source electrode or the drain electrode; or the IGZO device comprises a boron nitride layer contacting the source electrode and the drain electrode, and the black phosphorus layer is insulated by the boron nitride layer from the IGZO film, the source electrode and the drain electrode; or the IGZO device comprises a boron nitride layer over the channel but not contacting the source electrode or the drain electrode, and the black phosphorus layer contacts both the source electrode and the drain electrode but is insulated by the boron nitride layer from the IGZO film.

2. The method of claim 1, further comprising preparing the IGZO device by:
depositing the IGZO film onto the substrate by sputtering through a first mask; and
forming the source electrode and the drain electrode by sputtering through a second mask.

3. The method of claim 1, wherein the channel has a width of less than 100 microns separating the source electrode and the drain electrode.

4. The method of claim 3, wherein the width is 40 microns.

5. The method of claim 1, wherein the substrate is selected from a group consisting of $SiO_2$ coated Si, SiOx coated Si, $La_2O_3$ coated Si, $Al_2O_3$ coated Si, and polyethylene terephthalate.

6. The method of claim 1, wherein the IGZO film has a thickness of 10 nm-40 nm.

7. The method of claim 1, wherein the IGZO film has a thickness of 10 nm.

8. The method of claim 1, wherein the source electrode and the drain electrode have a material selected from a group consisting of indium zinc oxide, indium tin oxide, Au, Al, Cu and any combinations thereof.

9. The method of claim 1, wherein the black phosphorus layer has a thickness of 10 nm-100 nm.

10. The method of claim 1, wherein transferring the black phosphorus layer comprising carrying the black phosphorus on a transfer substrate selected from a group consisting of polydimethylsiloxane, polyethylene terephthalate, and polyimide.

* * * * *